United States Patent [19]

Hamlin

[11] Patent Number: 5,664,680
[45] Date of Patent: Sep. 9, 1997

[54] POCKETS FOR MICROCHIP CARRIERS

[75] Inventor: Robert N. Hamlin, Stillwater, Minn.

[73] Assignee: CariTech Inc., Hudson, Wis.

[21] Appl. No.: 631,665

[22] Filed: Apr. 9, 1996

[51] Int. Cl.[6] ................................ B65D 85/38
[52] U.S. Cl. .................. 206/714; 206/716; 206/728; 206/726
[58] Field of Search .................. 206/713, 714, 206/716, 726, 728, 560, 564

[56] References Cited

U.S. PATENT DOCUMENTS

| | | |
|---|---|---|
| 3,199,419 | 8/1965 | Lang, Jr. . |
| 3,311,229 | 3/1967 | Troll et al. . |
| 3,465,874 | 9/1969 | Hugle et al. . |
| 3,858,721 | 1/1975 | Boyer et al. . |
| 3,946,864 | 3/1976 | Hutson . |
| 4,272,473 | 6/1981 | Riemersma et al. . |
| 4,411,362 | 10/1983 | Itemadani et al. .............. 206/716 |
| 4,562,924 | 1/1986 | Okamoto ........................ 206/714 |
| 4,564,880 | 1/1986 | Christ et al. . |
| 4,702,370 | 10/1987 | Honda . |
| 4,712,675 | 12/1987 | Scholten et al. . |
| 4,819,801 | 4/1989 | Howard .......................... 206/564 |
| 4,898,275 | 2/1990 | Skrtic et al. . |
| 4,963,405 | 10/1990 | Yamashita et al. . |
| 4,966,281 | 10/1990 | Kawanishi et al. . |
| 4,966,282 | 10/1990 | Kawanishi et al. . |
| 5,026,303 | 6/1991 | Matsuoka et al. . |
| 5,066,245 | 11/1991 | Walker . |
| 5,076,427 | 12/1991 | Thomson et al. . |
| 5,101,975 | 4/1992 | Runyon et al. ................. 206/713 |
| 5,115,911 | 5/1992 | Schulte et al. . |
| 5,132,160 | 7/1992 | Bird . |
| 5,136,827 | 8/1992 | Sawaya . |
| 5,152,393 | 10/1992 | Chenoweth . |
| 5,199,564 | 4/1993 | Skrtic . |
| 5,226,226 | 7/1993 | Fierkens ........................ 206/713 |
| 5,234,104 | 8/1993 | Schulte et al. ................. 206/714 |
| 5,259,500 | 11/1993 | Alvite et al. . |
| 5,265,723 | 11/1993 | Chenoweth .................... 206/714 |
| 5,333,733 | 8/1994 | Murata ........................... 206/714 |
| 5,351,821 | 10/1994 | Skrtic ............................. 206/714 |
| 5,361,901 | 11/1994 | Schenz et al. ................. 206/714 |
| 5,390,472 | 2/1995 | Weiler et al. .................. 206/714 |
| 5,499,717 | 3/1996 | Hayashi ......................... 206/714 |
| 5,524,765 | 6/1996 | Gutentag ........................ 206/716 |

FOREIGN PATENT DOCUMENTS

| | | | |
|---|---|---|---|
| 0045368 | 2/1990 | Japan ............................. 206/332 |
| 0127256 | 5/1990 | Japan ............................. 206/330 |
| 404201872 | 7/1992 | Japan ............................. 206/330 |
| 405170275A | 7/1993 | Japan ............................. 206/332 |

*Primary Examiner*—David T. Fidei
*Attorney, Agent, or Firm*—Peterson, Wicks, Nemer & Kamrath, P.A.

[57] ABSTRACT

A carrier tape (12) is disclosed including a plurality of longitudinally spaced pockets (22) extending parallel to index holes (20). Each pocket (22) includes side walls (24) and a bottom (26) having provisions (28) for holding a microchip (32). Abutments (38) having semicircular cross sections are integrally formed on the side walls (24) for engaging the free ends of the leads (34) of the microchip (32) to prevent their engagement with the side walls (24). A greater number of abutments (38) at lesser spacings are provided than the leads (34) of the microchip (32) to prevent the leads (34) from hooking between the abutments (38). The abutments (38) are arranged to minimize the number of leads (34) actually engaged and to minimize the actual area contacted by the free ends of the leads (34) with the abutments (38). The shape of the abutments (38) also optically disperses major portions of the reflection of the leads (34). False indications of lead problems during non-contacting, electro-optical visual inspection of the microchip (32) within the pocket (22) are thereby eliminated.

19 Claims, 1 Drawing Sheet

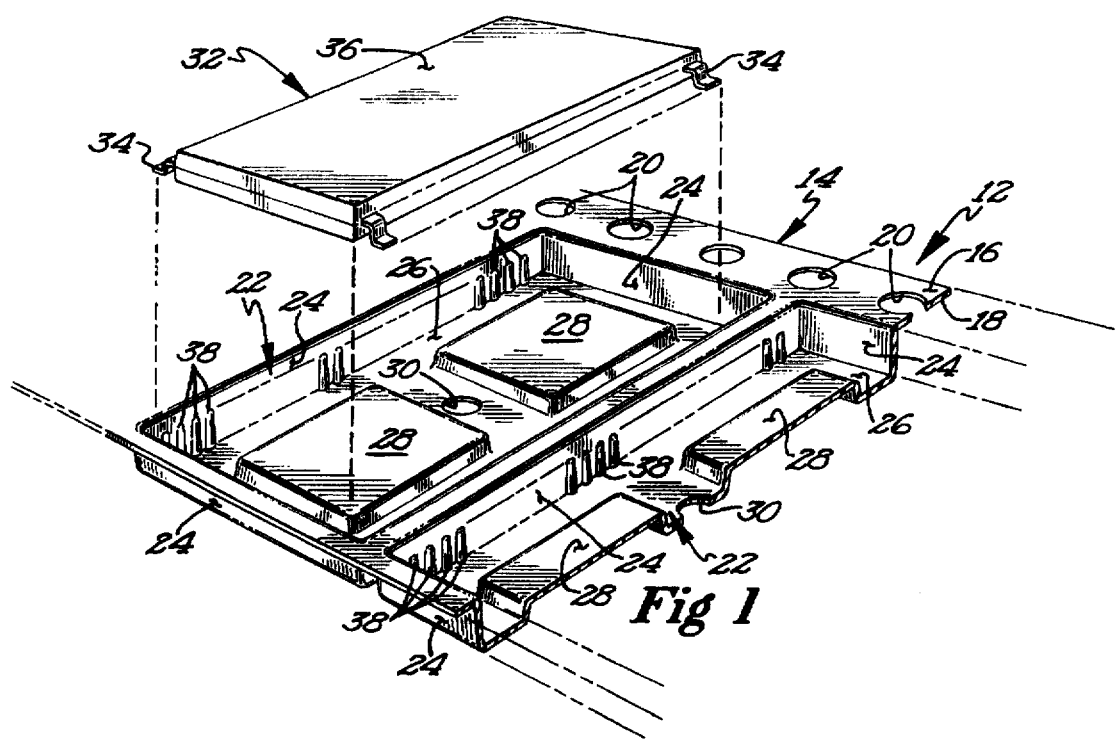
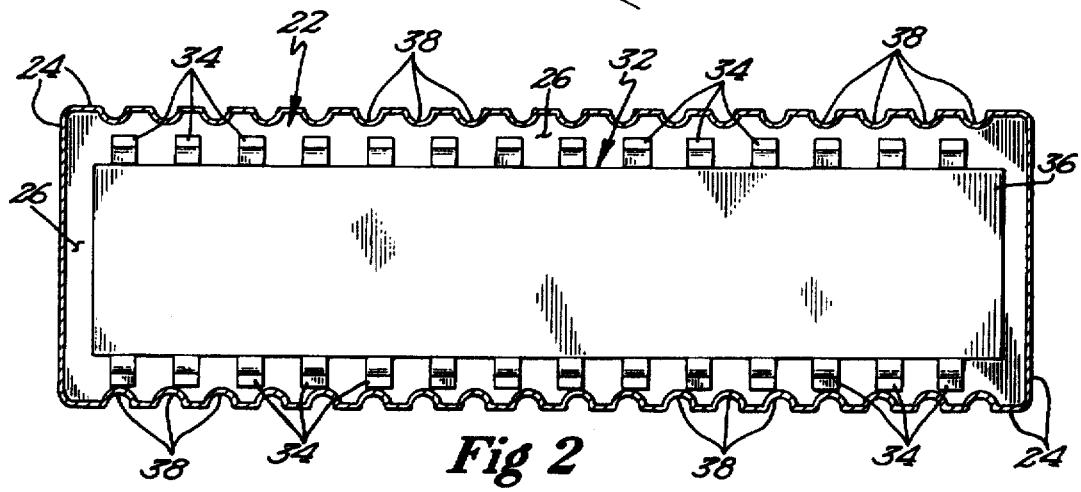
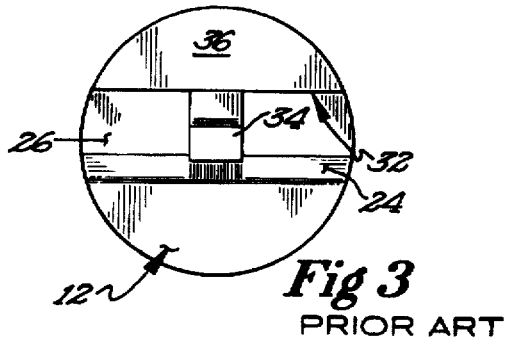
Fig 3
PRIOR ART
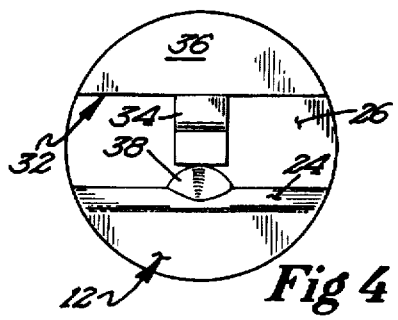
Fig 4

POCKETS FOR MICROCHIP CARRIERS

BACKGROUND

The present invention generally relates to packaging methods for electronic circuit components, particularly to improved pockets for packaging methods for electronic circuit components, and specifically to improved pockets for packaging methods for electronic circuit components for aiding in the non-contacting, electro-optical vision inspection of electronic circuit components located in the pockets.

A common packaging method for electronic circuit components such as microchips is placement into pockets located at precise intervals on a carrier medium. Specifically, such pockets could be arranged in arrays of rows and columns in trays and, especially common for small resistors, capacitors, and memory boards for surface mount assembly of circuit boards, could be arranged in continuous columns in carrier tapes.

As part of the manufacture of electronic circuit components, the leads of the electronic circuit components are inspected for improper bends, out of specification configurations, and like abnormalities. This inspection can occur while the electronic circuit components have been removed from the pocket, but this is a time consuming and relatively expensive procedure. This inspection can also occur while the electronic circuit components are in the pocket but before the pockets are covered in a manner to avoid accidental falling of the electronic circuit components from the pocket. Such in the pocket inspection generally utilizes non-contacting, electro-optical vision systems having frame grabbers and clever algorithms to compare the electronic circuit components in the pocket with a desired standard.

Although easier and less expensive to perform than out of the pocket inspection, in the pocket inspection results in the indication of many false rejections which require extra time for human inspection and override. Specifically, due to their placement out of center in the pocket or due to their shifting in the pocket due to movement of the pocket, the leads of the electronic circuit components can be located closely adjacent or abutting with the side walls of the pocket. Such leads can cause a reflection on the side walls which can not be differentiated from the actual lead by the electro-optical vision system and would then be considered as extra long leads. Since long leads would be a flaw in the manufacture of electronic circuit components, the inspection would indicate a rejection which typically stops operation until manually overridden by the operator. The manufacturers of electro-optical vision inspection systems have attempted to overcome this problem of the false indication of improper lead problems by various approaches such as but not limited to using point source lighting, using diffuse lighting, using polarizing or color filters, and the like. However, such attempts by manufacturers of electro-optical vision inspection systems have not been successful in overcoming this problem of the false indication of improper lead problems.

Thus, a need continues to exist in the field of in the pocket inspection of electronic circuit components for eliminating the false indication of lead problems as the result of the positioning of the leads in close vicinity to the side wall of the carrier pocket.

SUMMARY

This need and other problems in the field of in the pocket inspection of electronic circuit components have been solved by providing, in the most preferred form, abutments formed on the side walls of a pocket for receiving an electronic circuit component for abutting with the free ends of the leads of the electronic circuit component for preventing engagement of the leads with the side wall and for optically dispersing reflection of the leads. Thus, inspection of the electronic circuit component can occur while the electronic circuit component is located within the pocket while the false indication of lead problems as the result of the positioning of the leads in close vicinity to the side wall of the pocket is eliminated.

It is thus an object of the present invention to provide a novel carrier for electronic circuit components such as microchips.

It is further an object of the present invention to provide such a novel carrier in the preferred form of a carrier tape.

It is further an object of the present invention to provide such a novel carrier preventing engagement of the leads with the side walls of the pockets of the carrier.

It is further an object of the present invention to provide such a novel carrier optically dispersing reflection of the leads.

It is further an object of the present invention to provide such a novel carrier minimizing the area contacted by the free ends of the leads in the pocket.

These and further objects and advantages of the present invention will become clearer in light of the following detailed description of an illustrative embodiment of this invention described in connection with the drawings.

DESCRIPTION OF THE DRAWINGS

The illustrative embodiment may best be described by reference to the accompanying drawings where:

FIG. 1 shows a perspective view of a carrier tape according to the preferred teachings of the present invention, with an electronic circuit component being exploded therefrom.

FIG. 2 shows a cross-sectional view of the carrier tape of FIG. 1.

FIG. 3 shows a diagrammatic view of a shadow of a lead on the pocket side wall of prior carrier tapes.

FIG. 4 shows a diagrammatic view of a shadow of a lead on the pocket side wall of the carrier tape of FIG. 1.

All figures are drawn for ease of explanation of the basic teachings of the present invention only; the extensions of the Figures with respect to number, position, relationship, and dimensions of the parts to form the preferred embodiment will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "front", "back", "upper", "lower", "height", "width", "length", "thickness", "end", "side", "horizontal", "vertical", "longitudinal", "lateral", and similar terms are used herein, it should be understood that these terms have reference only to the structure shown in the drawings as it would appear to a person viewing the drawings and are utilized only to facilitate describing the invention.

DESCRIPTION

A carrier tape according to the preferred teachings of the present invention is shown in the drawings and generally designated 12. Carrier tape 12 generally includes a carrier medium in the preferred form of an elongated strip 14 made of semi-flexible, deformable material such as plastic and the like, with strip 14 including a front face 16 and a back face 18. A plurality of longitudinally spaced, indexing holes 20 extend through strip 14 in input stripes located parallel to and adjacent one or both edges of strip 14 in the most preferred form. Holes 20 serve as a finished product feature required by carrier tape 12 in the industry as set forth in Electronic Industries Association standards such as holes 20 can be 1.5 mm in diameter on 4 mm centers. A plurality of pockets 22 are provided at precise intervals on the carrier medium and in the preferred form shown are longitudinally spaced in a column extending parallel to index holes 20 and the edges of strip 14 and recessed from face 16 and extending beyond face 18 of strip 14. Each of pockets 22 include sidewalls 24 extending at an acute angle up to 90° from face 18 and a bottom 26 generally parallel to faces 16 and 18 and located on the opposite side of face 18 than face 16. Bottom 26 includes suitable provisions 28 for positioning a product such as a microchip or like electronic circuit component within pocket 22 with the leads of the microchip not engaging bottom 26 and ideally not engaging side walls 24. A hole 30 of nominal size in the order of 1.5 to 2.0 mm diameter is typically formed in bottom 26 within provisions 28 per Electronic Industries Association standards.

In the preferred embodiment shown, pockets 22 are of the type for receiving an electronic circuit component 32 in the form of a semiconductor I.C. device having a plurality of fine pitch leads 34 extending outwardly from the sides of its rectangularly shaped body 36, with fourteen leads 34 extending from the two elongated sides of body 36 being shown. Leads 34 are generally equally spaced along the sides of body 36 and terminate in free ends which are generally linear and parallel to the sides of body 36. However, it should be appreciated that component 32 can be of other forms, shapes, and the like according to the teachings of the present invention and that the teachings of the present invention are not limited to the particular form and shape of component 32 shown.

According to the teachings of the present invention, side walls 24 have a shape corresponding to that of the free ends of leads 34 of component 32 received within pockets 22 and include a plurality of spaced abutments 38 extending generally into pockets 22. In the most preferred form, abutments 38 are integrally formed with pockets 22 at the same time that pockets 22 are formed in the carrier medium, with pockets 22 being formed using conventional carrier tape forming processes. Abutments 38 should be positioned on side walls 24 to be horizontally aligned with leads 34 of component 32 positioned on provisions 28 and in the preferred form can extend generally from adjacent face 18 to bottom 26 and in the most preferred form can extend to and be formed in bottom 26. Abutments 38 abut with the free ends of leads 34 of component 32 within pocket 22 for preventing engagement of leads 34 with side walls 24. The faces of abutments 38 extending into pockets 22 have a shape for optically dispersing any reflection of leads 34 thereon. In the preferred form, abutments 38 have a shape which minimizes the actual area contacted by the free ends of leads 34 and in the most preferred form have horizontal cross sections parallel to bottom 26 of pockets 22 of a semicircular or V-shape. In particular, the horizontal length of the area of engagement by abutments 38 is considered smaller than the horizontal length of the free ends of leads 34.

According to the teachings of the present invention, the spacing and number of abutments 38 are such that the number of leads 34 which actually contact abutments 38 is minimized and such that abutments 38 will not cause bending or other damage to leads 34. In the most preferred form, a greater number of abutments 38 at a lesser spacing are provided on each side wall 24 than the number of leads 34 located on each side of component 32. Specifically, in the most preferred form where fourteen leads 34 extend from each side of component 32, eighteen abutments 38 are provided on each side wall 24, with the maximum width of abutments 38 at side wall 24 being generally equal to the widths of leads 34 and with the spacing between abutments 38 being equal and approximately 30% less than the spacing between leads 34. Thus, in the event that component 32 is slid towards one of side walls 24 while remaining generally parallel to side walls 24, some of the leads 34 will engage abutments 38 in some cases with their centers aligned but in most cases with the centers offset and some of the leads 34 will not engage any of abutments 38. As shown in FIG. 2, with component 32 located generally centered between side walls 24 extending parallel to index holes 30, the center of first lead 34 from the left generally engages the center of the first abutment 38, the left corner of second lead 34 from the left generally engages the center of the second abutment 38, the third lead 34 from the left is positioned between and does not engage the third and fourth abutments 38, the right corner of the fourth lead 34 from the left generally engages the center of the fifth abutment 38, and so on. It should then be noted that leads 34 generally abut with the center of abutments 38 which because of their semicircular cross sections is at the greatest spacing from side wall 34 and in particular do not extend to an extent less than the greatest spacing of abutments 38 from side wall 24. If the spacing between abutments 38 were such that the ends of leads 34 could extend between abutments 38 such as would be the case if abutments 38 were equally spaced apart at a spacing generally equal to the spacing between leads 34, then leads 34 could slide in an interfitting or gear-type relation with abutments 38 and be hooked between abutments 38 resulting in bending or damage of leads 34 if component 32 was moved relative to pocket 22. It can then be appreciated that abutments 38 can have other spacings and arrangements than equal spacing and still prevent an interfitting relation with leads 34 including but not limited to abutments 38 of variable spacings, groups of equally spaced abutments 38 at spacings different from other groups of abutments 38 which is not a whole number multiple of the spacings between abutments 38 in the groups, and the like.

It should further be appreciated that component 32 could have an offset relation to pocket 22 rather than a parallel relation to side walls 24 as shown in FIG. 2. As an example, the front left lead 34 could engage one of the abutments 38 of the front side wall 24 and the rear right lead 34 could engage one of the abutments 38 of the rear side wall 24. But in any case, abutments 38 would prevent abutment of leads 34 with side walls 24, the area of engagement between leads 34 and abutments 38 which are actually engaged is minimized, and leads 34 do not have an interfitting relation with abutments 38 whatever the position of component 32 in pocket 22.

Now that the basic construction of carrier tape 12 according to the preferred teachings of the present invention has been set forth, the use of carrier tape 12 in a non-contacting, electro-optical vision inspection system can be explained. Prior to the present invention, if leads 34 contacted or were closely adjacent side walls 24, the light necessary for operation of the inspection system caused the lead to have a reflection on side wall 24 as diagrammatically shown in FIG.

3. The inspection system utilized the combined length of the actual length of the lead 34 together with the length of its reflection on side wall 24 as it could not detect the difference between the lead 34 and its reflection. Thus, during comparison with the standard component 32 desired, the inspection system would consider that the lead of component 32 in pocket 22 as being too long and indicate a rejection which in this example would be incorrect assuming that the actual length of the lead 34 was proper if its reflection was properly not considered. It would then be necessary for the operator to determine why the inspection system indicated a rejection and manually override the inspection system so that inspection of components 32 in the remaining pockets 22 of carrier tape 12 would continue.

Carrier tape 12 according to the teachings of the present invention prevents abutment of leads 34 with side walls 24. Particularly, engagement of some of the leads 34 of component 32 with abutments 38 hold the free ends of leads 34 spaced a sufficient distance from side walls 24 so that the end of leads can be detected as being separate from side walls 24. It should then be appreciated that the engagement of some of the leads 34 of component 32 with abutments 38 will cause the creation of reflections on abutments 38. However, carrier tape 12 allows the inspection system to detect the difference between leads 34 and their reflection on abutments 38 according to the teachings of the present invention. Particularly, FIG. 4 shows a worse case scenario where the center of the lead 34 corresponds to the center of abutment 38. However, due to the minimal area of engagement between lead 34 and abutment 38 and the semicircular cross section of abutment 38, the reflection is in the form of a spike having a width considerably less than the width of lead 34 as the remaining, major portions of the reflection of lead 34 is dispersed. Although such non-dispersed reflection would also be detected by the inspection system, the inspection system can utilize a process referred to as high frequency edge trimming or noise removal to electronically substract this spike of reflection from the end of lead 34 and thus compare the desired standard with the actual length of lead 34. Vision analysis software for electronically substracting this spike of reflection is offered at least by COGNEX Corporation in Boston, Mass., USA. Thus, the false indication of lead problems as the result of detection of the reflection of leads 34 on abutments 38 and also side walls 24 is thereby eliminated.

In the preferred form shown in FIG. 2, the distance between abutments 38 on opposite side walls 24 is greater than the distance between the free ends of leads 34 on opposite sides of component 32. Thus, if component 32 is centered in pocket 22, none of the leads 34 would engage abutments 38. However, abutments 38 could be formed having a distance between opposite side walls 24 generally equal to that of the distance between the free ends of leads 34 on opposite sides of component 32. Thus, abutments 38 would center component 32 in pockets 22. In that event, abutments 38 could be shaped to accentuate this additional function such as having increasing spacing from side walls 24 with decreasing distance from bottom 26 of pocket 22 such as having abutments 38 being semispherical in shape.

Additionally, although semicircular or V-shaped cross sections have been set forth for abutments 38 as advantageously reducing the area of engagement with leads 34, abutments 38 according to the teachings of the present invention could have other shapes such as semispherical as set forth above as well as other shapes including but not limited to having concave depressions at the engagement area of abutments 38 with leads 34.

Although carrier tape 12 has been shown as including a single column of pockets 22, it should be appreciated that pockets 22 could be arranged in more than one column to form pockets 22 in an array of columns and rows on carrier tape 12. Likewise, although the carrier in the preferred form is formed of semi-flexible, deformable material to form tape 12, pockets 22 could be formed in carriers of other mediums such as but not limited to trays.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

I claim:

1. Carrier for electronic circuit components having a plurality of leads extending outwardly from a body, with the leads terminating in free ends and being spaced from each other, comprising, in combination: a pocket for receiving the electronic circuit component and including a side wall and a bottom, with the side wall having a shape corresponding to that of the free ends of the leads of the electronic circuit component received within the pocket; and means formed on the side wall for abutting with the free ends of the leads of the electronic circuit component within the pocket for preventing engagement of the leads with the side wall and for optically dispersing major portions of the reflection of the leads.

2. The carrier of claim 1 wherein the abutting means comprises a plurality of spaced abutments having a shape which minimizes the area contacted by the free ends of the leads of the electronic circuit component.

3. The carrier of claim 2 wherein the abutments have semicircular cross sections parallel to the bottom of the pocket.

4. The carrier of claim 2 wherein the spacings between the abutments are not equal to the spacings between the leads of the electronic circuit component for preventing the abutments from interfitting with the leads.

5. The carrier of claim 4 wherein the spacings between the abutments are equal.

6. The carrier of claim 5 wherein the number of abutments formed on the side wall of the pocket is greater than the number of leads extending outwardly from a side of the electronic circuit component corresponding to a length of the side wall of the pocket aligned with the side of the electronic circuit component on which the abutments are formed.

7. The carrier of claim 2 wherein the number of abutments formed on the side wall of the pocket is greater than the number of leads extending outwardly from a side of the electronic circuit component corresponding to a length of the side wall of the pocket aligned with the side of the electronic circuit component on which the abutments are formed.

8. The carrier of claim 2 wherein a plurality of pockets are provided at precise intervals on a carrier medium.

9. The carrier of claim 8 wherein the plurality of pockets are arranged at precise intervals in a column.

10. The carrier of claim 8 wherein the carrier medium is formed of semi-flexible material; and wherein the carrier further comprises, in combination: a plurality of longitudinally spaced, indexing holes extending through the carrier medium.

11. The carrier of claim 2 wherein the spacings between the abutments prevent the free ends of the leads from extending between the abutments.

12. The carrier of claim 1 wherein the abutting and optically dispersing means prevent an interfitting relation with the leads.

13. Carrier for electronic circuit components having a plurality of leads extending outwardly from a body, with the leads terminating in free ends and being spaced from each other, comprising, in combination: a pocket for receiving the electronic circuit component and including a side wall and a bottom, with the side wall having a shape corresponding to that of the free ends of the leads of the electronic circuit component received within the pocket; and means formed on the side wall for abutting with the free ends of the leads of the elecronic circuit component within the pocket for preventing engagement of the leads with the side wall; wherein the abutting means comprises a plurality of spaced abutments having a shape which minimizes the area contacted by the free ends of the leads of the electronic circuit component; and wherein the spacings between the abutments are not equal to the spacings between the leads of the electronic circuit component for preventing the abutments from interfitting with the leads.

14. The carrier of claim 13 wherein the spacings between the abutments are equal.

15. The carrier of claim 14 wherein the number of abutments formed on the side wall of the pocket is greater than the number of leads extending outwardly from a side of the electronic circuit component corresponding to a length of the side wall of the pocket aligned with the side of the electronic circuit component on which the abutments are formed.

16. The carrier of claim 13 wherein the abutments have semicircular cross sections parallel to the bottom of the pocket.

17. The carrier of claim 13 wherein a plurality of pockets are provided at precise intervals on a carrier medium.

18. The carrier of claim 17 wherein the plurality of pockets are arranged at precise intervals in a column.

19. The carrier of claim 17 wherein the carrier medium is formed of semi-flexible material; and wherein the carrier further comprises, in combination: a plurality of longitudinally spaced, indexing holes extending through the carrier medium.

* * * * *